United States Patent
Gleissner

(10) Patent No.: US 9,657,397 B2
(45) Date of Patent: May 23, 2017

(54) APPARATUS FOR TREATING SURFACES OF WAFER-SHAPED ARTICLES

(71) Applicant: LAM RESEARCH AG, Villach (AT)

(72) Inventor: Andreas Gleissner, Dobriach (AT)

(73) Assignee: LAM RESEARCH AG, Villach (AT)

( * ) Notice: Subject to any disclaimer, the term of this patent is extended or adjusted under 35 U.S.C. 154(b) by 468 days.

(21) Appl. No.: 14/144,846

(22) Filed: Dec. 31, 2013

(65) Prior Publication Data

US 2015/0187624 A1    Jul. 2, 2015

(51) Int. Cl.
| | | |
|---|---|---|
| C23F 1/08 | (2006.01) | |
| H01J 37/32 | (2006.01) | |
| H01L 21/67 | (2006.01) | |
| H01L 21/687 | (2006.01) | |

(52) U.S. Cl.
CPC .......... *C23F 1/08* (2013.01); *H01J 37/32467* (2013.01); *H01J 37/32495* (2013.01); *H01J 37/32715* (2013.01); *H01L 21/6719* (2013.01); *H01L 21/67126* (2013.01); *H01L 21/68792* (2013.01)

(58) Field of Classification Search
CPC ................ C23F 1/08; H01L 21/68792; H01L 21/67126; H01L 21/6719; H01J 37/32495; H01J 37/32467; H01J 37/32715
USPC .......................................... 118/715; 156/345.1
See application file for complete search history.

(56) References Cited

U.S. PATENT DOCUMENTS

| | | | | |
|---|---|---|---|---|
| 4,903,717 A | | 2/1990 | Sumnitsch | |
| 4,928,626 A | * | 5/1990 | Carlson | C23C 16/455 117/101 |
| 5,229,081 A | * | 7/1993 | Suda | C23C 16/455 118/620 |
| 5,488,925 A | * | 2/1996 | Kumada | C23C 16/455 118/715 |
| 5,513,668 A | | 5/1996 | Sumnitsch | |
| 5,871,586 A | * | 2/1999 | Crawley | C23C 16/45514 118/715 |
| 6,403,491 B1 | * | 6/2002 | Liu | H01J 37/32522 257/E21.252 |
| 6,428,847 B1 | * | 8/2002 | Grant | C23C 16/455 118/715 |
| 6,432,259 B1 | * | 8/2002 | Noorbakhsh | H01J 37/321 118/723 E |
| 6,485,531 B1 | | 11/2002 | Schob | |
| 6,716,302 B2 | * | 4/2004 | Carducci | H01J 37/32522 118/715 |
| 6,746,565 B1 | * | 6/2004 | Bleck | H01L 21/67075 156/345.12 |
| 6,818,096 B2 | * | 11/2004 | Barnes | H01J 37/32532 118/723 E |

(Continued)

FOREIGN PATENT DOCUMENTS

WO    2007/101764    9/2007

*Primary Examiner* — Rudy Zervigon

(57) ABSTRACT

An apparatus for processing wafer-shaped articles comprises a closed process chamber providing a gas-tight enclosure. A rotary chuck is located within the closed process chamber, the rotary chuck being adapted to hold a wafer shaped article thereon. A lid is secured to an upper part of the closed process chamber, the lid comprising an upper plate formed from a composite fiber-reinforced material and a lower plate that faces into the process chamber and is formed from a chemically-resistant plastic.

13 Claims, 2 Drawing Sheets

(56) References Cited

U.S. PATENT DOCUMENTS

| | | | |
|---|---|---|---|
| 6,884,296 B2* | 4/2005 | Basceri | C23C 16/45514 118/715 |
| 7,794,544 B2* | 9/2010 | Nguyen | C23C 16/0272 118/715 |
| 8,067,493 B2* | 11/2011 | Zhu | B82Y 30/00 521/48 |
| 8,291,857 B2* | 10/2012 | Lam | C23C 16/4412 118/715 |
| 8,382,939 B2* | 2/2013 | Kutney | H01J 37/3244 118/50 |
| 8,778,079 B2* | 7/2014 | Begarney | C23C 16/45508 118/715 |
| 9,032,906 B2* | 5/2015 | Ma | C23C 16/18 118/715 |
| 2002/0124961 A1* | 9/2002 | Porter | B01F 3/022 156/345.33 |
| 2003/0037880 A1* | 2/2003 | Carducci | H01J 37/32522 156/345.43 |
| 2003/0047202 A1* | 3/2003 | Worm | B08B 7/0021 134/157 |
| 2003/0124820 A1* | 7/2003 | Johnsgard | C23C 16/455 438/482 |
| 2004/0028810 A1* | 2/2004 | Grant | C23C 16/4412 427/248.1 |
| 2004/0035358 A1* | 2/2004 | Basceri | C23C 16/45514 118/715 |
| 2005/0000423 A1* | 1/2005 | Kasai | C23C 16/45565 118/715 |
| 2005/0193948 A1* | 9/2005 | Oohirabaru | H01L 21/6719 118/719 |
| 2005/0193953 A1* | 9/2005 | Makino | H01J 37/32513 118/733 |
| 2006/0142455 A1* | 6/2006 | Agarwal | B82Y 30/00 524/423 |
| 2007/0095285 A1* | 5/2007 | Thakur | C23C 16/4412 118/715 |
| 2007/0110895 A1* | 5/2007 | Rye | H01L 21/67051 427/240 |
| 2007/0113783 A1* | 5/2007 | Lee | C23C 16/4404 118/715 |
| 2007/0119370 A1* | 5/2007 | Ma | C23C 16/18 118/723 E |
| 2007/0265379 A1* | 11/2007 | Chen | B82Y 30/00 524/404 |
| 2008/0011334 A1* | 1/2008 | Rye | H01L 21/67051 134/95.1 |
| 2008/0242789 A1* | 10/2008 | Zhu | C08L 67/02 524/451 |
| 2009/0095221 A1* | 4/2009 | Tam | C23C 16/45565 118/715 |
| 2009/0095222 A1* | 4/2009 | Tam | C23C 16/45565 118/723 R |
| 2009/0099299 A1* | 4/2009 | Gallucci | C08L 79/08 524/538 |
| 2009/0099300 A1* | 4/2009 | Gallucci | C08G 73/1046 524/592 |
| 2009/0105385 A1* | 4/2009 | Park | B82Y 30/00 524/406 |
| 2009/0130794 A1* | 5/2009 | Probst | C23C 14/243 438/84 |
| 2010/0024727 A1* | 2/2010 | Kim | C23C 16/45565 118/715 |
| 2010/0210745 A1* | 8/2010 | McDaniel | C09D 5/008 521/55 |
| 2010/0212591 A1* | 8/2010 | He | C23C 16/4412 118/715 |
| 2010/0294199 A1* | 11/2010 | Tran | C23C 16/4401 118/723 R |
| 2011/0162800 A1* | 7/2011 | Noorbakhsh | C23C 16/45565 156/345.34 |
| 2011/0201181 A1* | 8/2011 | Tanaka | C23C 16/303 438/478 |
| 2012/0027936 A1* | 2/2012 | Gurary | C23C 16/4407 427/255.5 |
| 2012/0163758 A1* | 6/2012 | McCullough | H01B 7/14 385/101 |
| 2012/0309204 A1* | 12/2012 | Kang | H01J 37/3244 438/719 |
| 2013/0062839 A1 | 3/2013 | Tschinderle et al. | |
| 2013/0098477 A1* | 4/2013 | Yudovsky | F17D 3/00 137/507 |
| 2013/0134128 A1* | 5/2013 | Tschinderle | H01L 21/67051 216/58 |
| 2014/0209027 A1* | 7/2014 | Lubomirsky | B05B 1/005 118/724 |
| 2014/0227883 A1* | 8/2014 | Izumoto | H01L 21/6708 438/745 |
| 2015/0187568 A1* | 7/2015 | Pettinger | H01J 37/3244 118/708 |
| 2015/0187612 A1* | 7/2015 | Obweger | H01L 21/67109 216/84 |
| 2015/0187624 A1* | 7/2015 | Gleissner | H01J 37/32467 156/345.23 |
| 2015/0187629 A1* | 7/2015 | Obweger | B05B 13/0228 118/730 |
| 2016/0064242 A1* | 3/2016 | Obweger | H01L 21/6708 134/1.3 |

* cited by examiner

APPARATUS FOR TREATING SURFACES OF WAFER-SHAPED ARTICLES

BACKGROUND OF THE INVENTION

1. Field of the Invention

The invention relates generally to an apparatus for treating surfaces of wafer-shaped articles, such as semiconductor wafers, wherein one or more treatment fluids may be recovered from within a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

An improved design for closed chamber single wafer wet processing is described in commonly-owned copending application U.S. Pub. No. 2013/0062839, in which a side door permits loading and removal of wafers into and from the process chamber, whereas process liquids and gases may be led into the chamber through a lid secured at the top of the closed process chamber.

SUMMARY OF THE INVENTION

The present inventors have developed an improved apparatus for treating wafer-shaped articles, as well as an improved lid for use with such an apparatus.

Thus, the invention in one aspect relates to an apparatus for processing wafer-shaped articles, comprising a closed process chamber, the closed process chamber comprising a housing providing a gas-tight enclosure. A rotary chuck is located within the closed process chamber, the rotary chuck being adapted to hold a wafer shaped article thereon. A lid is secured to an upper part of the closed process chamber, the lid comprising an upper plate formed from a composite fiber-reinforced material and a lower plate that faces into the process chamber and is formed from a chemically-resistant plastic.

In preferred embodiments of the apparatus according to the present invention, the upper plate is formed from carbon-fiber reinforced plastic.

In preferred embodiments of the apparatus according to the present invention, the carbon-fiber reinforced plastic comprises a binding polymer selected from the group consisting of epoxy, polyester, vinyl ester and nylon.

In preferred embodiments of the apparatus according to the present invention, the fiber reinforced material comprises carbon fiber and at least one other fiber selected from the group consisting of aramid fiber, aluminium fiber and glass fiber.

In preferred embodiments of the apparatus according to the present invention, the fiber reinforced material comprises arrays of aligned carbon nanotubes.

In preferred embodiments of the apparatus according to the present invention, the chemically-resistant plastic is selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In preferred embodiments of the apparatus according to the present invention, the chemically-resistant plastic is ethylene chlorotrifluoroethylene (ECTFE).

In preferred embodiments of the apparatus according to the present invention, the lid further comprises a stainless steel plate sandwiched between the upper and lower plates.

In preferred embodiments of the apparatus according to the present invention, the lid is traversed by multiple bores for accommodating inlet nozzles for introducing gases and liquids into the process chamber.

In preferred embodiments of the apparatus according to the present invention, at least the upper plate of the lid is traversed by plural elongated slots for accommodating valve manifolds for introducing liquids into the process chamber at a plurality of locations.

In preferred embodiments of the apparatus according to the present invention, the upper plate is larger than the lower plate and overlies the lower plate with a peripheral region of the upper plate extending outwardly of the lower plate.

In preferred embodiments of the apparatus according to the present invention, the peripheral region of the upper plate comprises holes aligned with bores in a wall of the process chamber, to accommodate bolts for securing the lid to the wall of the process chamber.

In preferred embodiments of the apparatus according to the present invention, the lid is adapted to withstand an overpressure within the process chamber of greater than 1 bar or to withstand a vacuum within said process chamber of lower than −0.5 bar.

In another aspect, the present invention relates to a lid for closing a process chamber used for processing wafer-shaped articles, the lid comprising an upper plate formed from a composite fiber-reinforced material and a lower plate formed from a chemically-resistant plastic.

In preferred embodiments of the lid according to the present invention, the upper plate is formed from carbon-fiber reinforced plastic.

In preferred embodiments of the lid according to the present invention, the chemically-resistant plastic is selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In preferred embodiments of the lid according to the present invention, a stainless steel plate is sandwiched between the upper and lower plates.

In preferred embodiments of the lid according to the present invention, the lid is traversed by multiple bores for accommodating inlet nozzles for introducing gases and liquids into the process chamber.

In preferred embodiments of the lid according to the present invention, the upper plate is larger than the lower plate and overlies the lower plate with a peripheral region of the upper plate extending outwardly of the lower plate.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
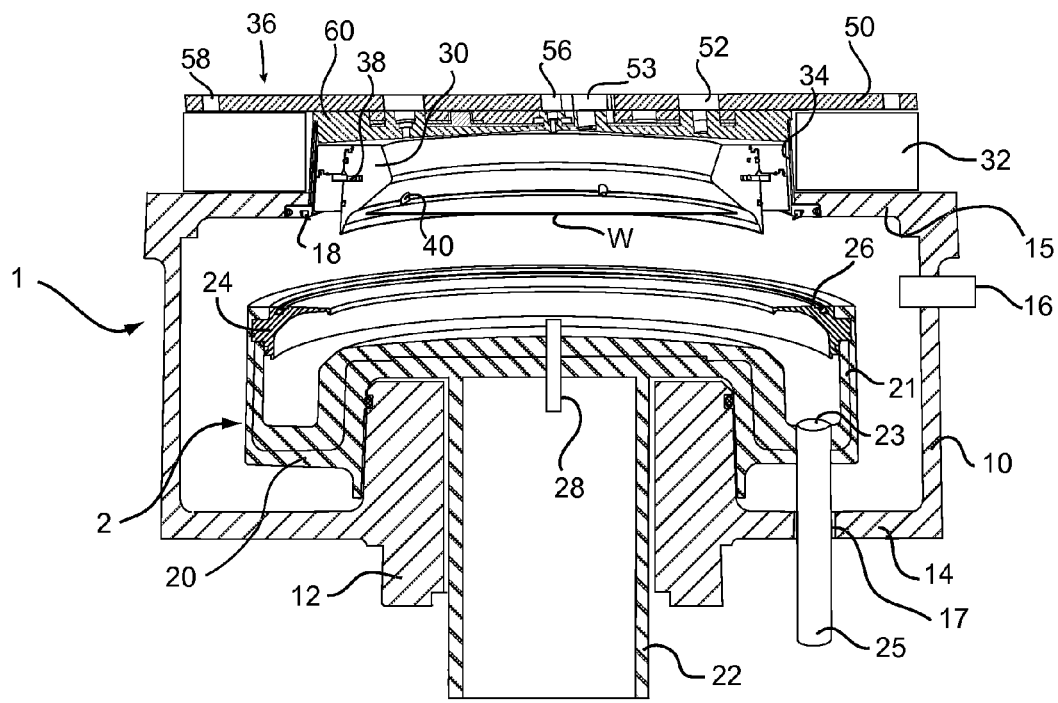
FIG. 1 is an explanatory cross-sectional side view of a process chamber according to a first embodiment of the invention, with the interior cover shown in its first position.

Referring now to FIG. 1, an apparatus for treating surfaces of wafer-shaped articles according to a first embodiment of the invention comprises an outer process chamber 1, which is preferably made of aluminum coated with PFA (perfluoroalkoxy) resin. The chamber in this embodiment has a main cylindrical wall 10, a lower part 12 and an upper part 15. From upper part 15 there extends a narrower cylindrical wall 34, which is closed by a lid 36.

A rotary chuck 30 is disposed in the upper part of chamber 1, and surrounded by the cylindrical wall 34. Rotary chuck 30 rotatably supports a wafer W during use of the apparatus. The rotary chuck 30 incorporates a rotary drive comprising ring gear 38, which engages and drives a plurality of eccentrically movable gripping members for selectively contacting and releasing the peripheral edge of a wafer W.

In this embodiment, the rotary chuck 30 is a ring rotor provided adjacent to the interior surface of the cylindrical wall 34. A stator 32 is provided opposite the ring rotor adjacent the outer surface of the cylindrical wall 34. The rotor 30 and stator 32 serve as a motor by which the ring rotor 30 (and thereby a supported wafer W) may be rotated through an active magnetic bearing. For example, the stator 32 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

The lid 36 is of an improved design, and comprises an upper plate 50 formed from a composite fiber-reinforced material and a lower plate 60 that faces into the process chamber and is formed from a chemically-resistant plastic, which in this embodiment is ECTFE. Sandwiched between the upper plate 50 and lower plate 60 in this embodiment is a stainless steel plate 70.

In the device described in the aforementioned commonly-owned copending application U.S. Pub. No. 2013/0062839, the lid was formed from stainless steel coated with perfluoroalkoxy (PFA); however, the present inventors found that such a structure could not withstand overpressures of greater than 0.8 bar, particularly when the lid is traversed by multiple holes and slots to accommodate various fluid medium inlets and valve manifolds.

By contrast, a lid such as that illustrated in FIGS. 1-4 is stiffer, lighter and much more robust as compared to the earlier coated version. Despite the presence in this embodiment of three elongated slots 53 to accommodate valve manifolds 55, as well as one or more through holes 56 to permit introduction of process fluids into the chamber through the lid 36, and bores 52 by which the upper plate 50 is rigidly secured to the lower plate 60, a lid 36 constructed according to the teachings of the present invention can withstand an overpressure within the process chamber of greater than 1 bar and can moreover withstand a vacuum within the process chamber of lower than −0.5 bar.

The optional stainless steel plate 70 serves to further increase the stiffness of the lid 36 in the region where the lid is traversed by elongated slots 53.

Figure 3:
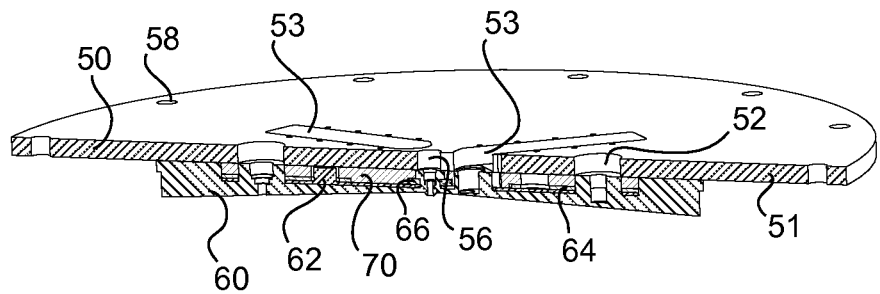
FIG. 3 is sectional perspective view of an embodiment of a lid according to the present invention.
Figure 4:
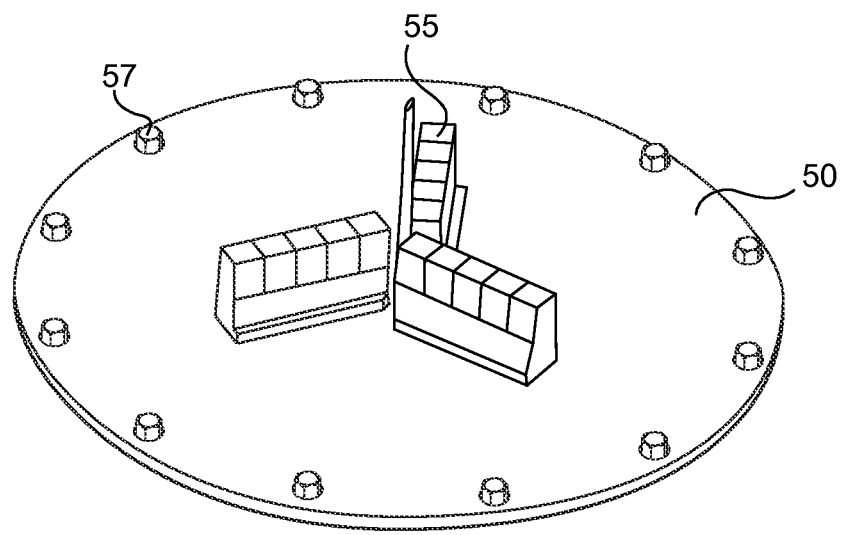
FIG. 4 is a perspective view of another embodiment of a lid according to the present invention.

As can be seen in FIG. 3, the lid 36 may further include an electrical heating layer 62 for heating the lower plate 60 to a temperature that prevents condensation of process vapors from occurring on the surface of plate 60 that faces into the process chamber. Electrical heating layer 62 is preferably a silicone rubber heater.

Spacer plate 64 serves to maintain the heater layer 62 pressed into contact with lower plate 60, as does the annular spacer 66, which latter element is preferably formed from stainless steel.

Lid 36 may be secured to the process chamber by bolts 57 that pass through bores 58.

It will be noted that the wafer W in this embodiment hangs downwardly from the rotary chuck 30, supported by the gripping members 40, such that fluids supplied through inlet 56 would impinge upon the upwardly facing surface of the wafer W.

In case wafer 30 is a semiconductor wafer, for example of 300 mm or 450 mm diameter, the upwardly facing side of wafer W could be either the device side or the obverse side of the wafer W, which is determined by how the wafer is positioned on the rotary chuck 30, which in turn is dictated by the particular process being performed within the chamber 1.

The apparatus of FIG. 1 further comprises an interior cover 2, which is movable relative to the process chamber 1. Interior cover 2 is shown in FIG. 1 in its first, or open, position, in which the rotary chuck 30 is in communication with the outer cylindrical wall 10 of chamber 1. Cover 2 in this embodiment is generally cup-shaped, comprising a base 20 surrounded by an upstanding cylindrical wall 21. Cover 2 furthermore comprises a hollow shaft 22 supporting the base 20, and traversing the lower wall 14 of the chamber 1.

Hollow shaft 22 is surrounded by a boss 12 formed in the main chamber 1, and these elements are connected via a dynamic seal that permits the hollow shaft 22 to be displaced relative to the boss 12 while maintaining a gas-tight seal with the chamber 1.

At the top of cylindrical wall 21 there is attached an annular deflector member 24, which carries on its upwardly-facing surface a gasket 26. Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 1 via a dynamic seal 17 so that the pipe may slide axially relative to the bottom wall 14 while maintaining a gas-tight seal.

An exhaust opening 16 traverses the wall 10 of chamber 1, and is connected to a suitable exhaust conduit.

The position depicted in FIG. 1 corresponds to loading or unloading of a wafer W. In particular, a wafer W can be loaded onto the rotary chuck 30 either through the lid 36, or, more preferably, through a side door (not shown) in the chamber wall 10. However, when the lid 36 is in position and when any side door has been closed, the chamber 1 is gas-tight and able to maintain a defined internal pressure.

Figure 2:
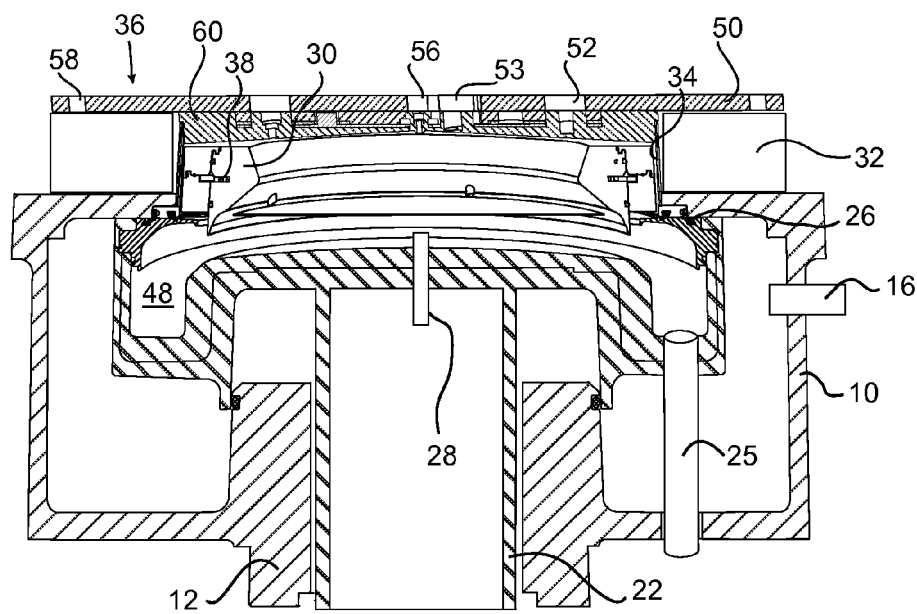
FIG. 2 is an explanatory cross-sectional side view of a process chamber according to the first embodiment of the invention, with the interior cover shown in its second position.

In FIG. 2, the interior cover 2 has been moved to its second, or closed, position, which corresponds to processing of a wafer W. That is, after a wafer W is loaded onto rotary chuck 30, the cover 2 is moved upwardly relative to chamber 1, by a suitable motor (not shown) acting upon the hollow shaft 22. The upward movement of the interior cover 2 continues until the deflector member 24 comes into contact with the interior surface of the upper part 15 of chamber 1. In particular, the gasket 26 carried by deflector 24 seals against the underside of upper part 15, whereas the gasket 18 carried by the upper part 15 seals against the upper surface of deflector 24.

When the interior cover 2 reaches its second position as depicted in FIG. 2, there is thus created a second chamber 48 within the closed process chamber 1. Inner chamber 48 is moreover sealed in a gas tight manner from the remainder of the chamber 1. Moreover, the chamber 48 is preferably separately vented from the remainder of chamber 1, which is achieved in this embodiment by the provision of the exhaust port 46 opening into the chamber 48, independently from the exhaust port 16 that serves the chamber 1 in general, and the remainder of the chamber 1 in the FIG. 2 configuration.

During processing of a wafer, processing fluids may be directed through medium inlets 56 and/or 28 to a rotating wafer W in order to perform various processes, such as etching, cleaning, rinsing, and any other desired surface treatment of the wafer undergoing processing.

Provision of the inner chamber 48 within the overall process chamber 1 thus enhances the safety of environmentally closed chambers by permitting the gases and liquids used for wafer processing to be better isolated from the exterior environment of the process chamber, and reduces the risk of process gas, chemical fumes, hot vapor such as vaporized isopropyl alcohol, ozone and the like being released to the tool environment.

It will be understood that the foregoing description and specific embodiments shown herein are merely illustrative of the invention and the principles thereof, and that modifications and additions may be easily made by those skilled in the art without departing from the spirit and scope of the invention, which is therefore understood to be limited only by the scope of the appended claims.

What is claimed is:

1. Apparatus for processing wafer-shaped articles, comprising:
    a closed process chamber, said closed process chamber comprising a housing providing a gas-tight enclosure;
    a rotary chuck located within said closed process chamber, said rotary chuck being adapted to hold a wafer shaped article thereon; and
    a lid secured to an upper part of said closed process chamber, said lid comprising an upper plate formed from a composite fiber-reinforced material and a lower plate that faces into said process chamber and is formed from a chemically-resistant plastic, wherein
        said lower plate underlies a central region of said upper plate, and
        an upper surface of said lower plate is adjacent to and in contact with a lower surface of said upper plate in said central region of said upper plate.

2. The apparatus according to claim 1, wherein said upper plate is formed from carbon-fiber reinforced plastic.

3. The apparatus according to claim 2, wherein said carbon-fiber reinforced plastic comprises a binding polymer selected from the group consisting of epoxy, polyester, vinyl ester and nylon.

4. The apparatus according to claim 1, wherein said fiber reinforced material comprises carbon fiber and at least one other fiber selected from the group consisting of aramid fiber, aluminum fiber and glass fiber.

5. The apparatus according to claim 1, wherein said fiber reinforced material comprises arrays of aligned carbon nanotubes.

6. The apparatus according to claim 1, wherein said chemically-resistant plastic is selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

7. The apparatus according to claim 6, wherein said chemically-resistant plastic is ethylene chlorotrifluoroethylene (ECTFE).

8. The apparatus according to claim 1, wherein said lid further comprises a stainless steel plate sandwiched between the upper and lower plates.

9. The apparatus according to claim 1, wherein said lid is traversed by multiple bores for accommodating inlet nozzles for introducing gases and liquids into said process chamber.

10. The apparatus according to claim 1, wherein at least said upper plate of said lid is traversed by plural elongated slots for accommodating valve manifolds for introducing liquids into said process chamber at a plurality of locations.

11. The apparatus according to claim 1, wherein said upper plate is larger than said lower plate and overlies said lower plate with a peripheral region of the upper plate extending outwardly of the lower plate.

12. The apparatus according to claim 11, wherein the peripheral region of the upper plate comprises holes aligned with bores in a wall of said process chamber, to accommodate bolts for securing the lid to the wall of said process chamber.

13. The apparatus according to claim 1, wherein said lid is adapted to withstand an overpressure within said process chamber of greater than 1 bar or to withstand a vacuum within said process chamber of lower than −0.5 bar.

* * * * *